United States Patent [19]
Godek et al.

[11] Patent Number: 5,321,380
[45] Date of Patent: Jun. 14, 1994

[54] LOW PROFILE PRINTED CIRCUIT BOARD

[75] Inventors: Paul W. Godek, Brockton; Michael J. Grennan, Hull, both of Mass.

[73] Assignee: Power General Corporation, Canton, Mass.

[21] Appl. No.: 973,042

[22] Filed: Nov. 6, 1992

[51] Int. Cl.⁵ .................................................. H01F 5/00
[52] U.S. Cl. ...................................... 336/232; 336/200; 336/83; 174/260
[58] Field of Search .......................... 336/200, 83, 232; 174/250, 260, 266

[56] References Cited

U.S. PATENT DOCUMENTS

| | | | |
|---|---|---|---|
| 3,129,398 | 4/1964 | Lheureux | 336/200 |
| 4,494,100 | 1/1985 | Stengel et al. | 336/200 |
| 4,543,553 | 9/1985 | Mandai et al. | 336/83 |
| 4,547,961 | 10/1985 | Bokil et al. | 336/200 |
| 4,622,627 | 11/1986 | Rodriguez et al. | 363/37 |
| 5,010,314 | 4/1991 | Estrov | 336/198 |
| 5,032,815 | 7/1991 | Kobayashi et al. | 336/83 |
| 5,039,964 | 8/1991 | Ikeda | 336/200 |

FOREIGN PATENT DOCUMENTS

| | | | |
|---|---|---|---|
| 267108 | 5/1968 | European Pat. Off. | 336/200 |
| 318955 | 6/1989 | European Pat. Off. | 336/83 |
| 3721759 | 1/1989 | Fed. Rep. of Germany | 336/200 |
| 85/00072 | 1/1985 | World Int. Prop. O. | 336/200 |

Primary Examiner—Leo P. Picard
Assistant Examiner—L. Thomas
Attorney, Agent, or Firm—McCormick, Paulding & Huber

[57] ABSTRACT

The present invention provides a low-profile printed circuit board including a substrate having at least one planar magnetic element supported thereon. The element includes a planar winding integral with the conductive circuit formed on either one or the other side of the board, and electrical communication is made from one side of the board to the other side via plated through holes provided in the substrate. Additional planar windings may be surface mounted to the winding carried by the substrate. A dielectric coating is also provided which completely isolates the winding of the planar magnetic element.

5 Claims, 2 Drawing Sheets

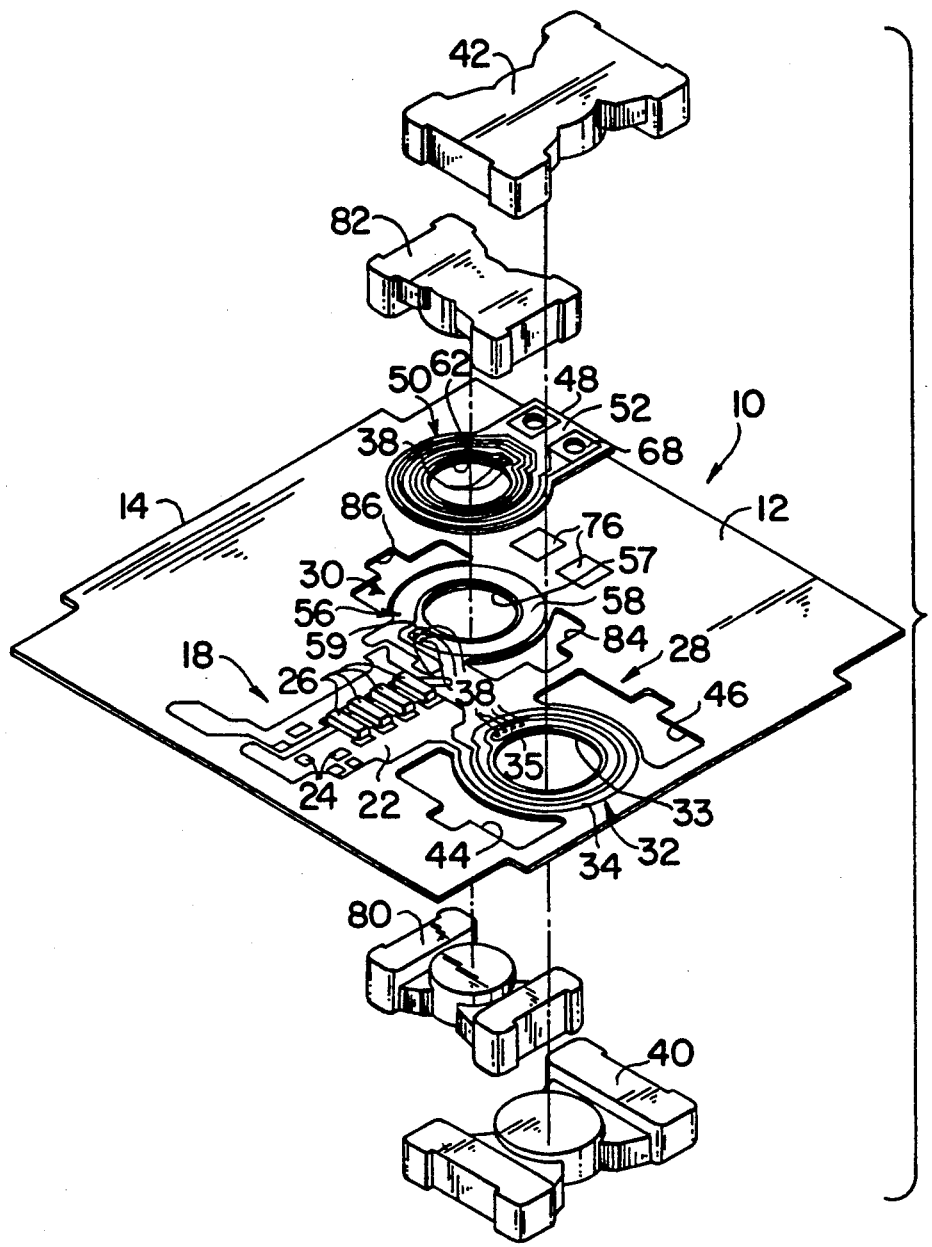
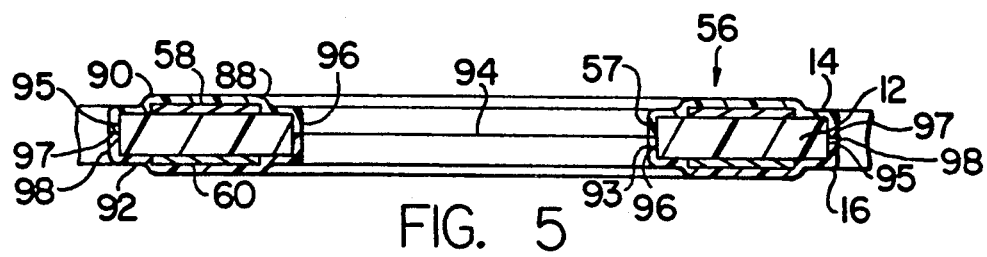

LOW PROFILE PRINTED CIRCUIT BOARD

BACKGROUND OF THE INVENTION

The present invention relates to a low-profile printed circuit board and, more particularly, relates to such a printed circuit board including planar magnetic elements.

Recent advances have been made in designing and building low profile printed circuit boards. In the quest for reliable, miniaturized, low profile circuits built on insulating substrates such as plastics and ceramics, there has been a shift from high profile components with solderable leads to chip mounted components. With the advent of thick-film technology and advanced etching techniques, there has been a further shift toward screen-printing or etching components and circuits such as resistors, capacitors and circuit conductor paths directly on a substrate. Such components are not only extremely low-profile, but also have proven to be temperature and vibration stable, repeatable and cost effective.

Although there are advantages associated with the printing or etching of components and circuits, it has been difficult to produce planar magnetic elements such as inductors and transformers by these methods. One reason for this difficulty is the limited surface area available on the substrate to accommodate the two-dimensional windings required to construct planar magnetic elements. Moreover, since the windings are printed in a roughly spiral shape, the inner terminus or end of the winding is surrounded by the outer turns of the spiral. Thus, a mechanical bridge together with possible solder connections or a multi-layer circuit is needed to connect the inner end of the winding with other circuitry on the substrate. Difficulties also arise in insulating from one another the individual two-dimensional windings which are often stacked to form a planar magnetic element such as, for example, a transformer.

There have been attempts to overcome the various problems associated with printed circuit boards incorporating planar magnetic elements. U.S. Pat. No. 4,622,627 discloses a planar magnetic transformer which includes a primary winding formed on a first substrate and a secondary winding located on the same or opposite face of the first substrate or on a second substrate. Top and bottom inductive cores are connected together through apertures in the substrate(s) and magnetically coupled with the windings. While it is possible to achieve a low-profile transformer in this manner, there remains the problem of the inner terminus of the winding being surrounded by the outer turns of the spiral. Accordingly, a mechanical connection or additional dielectric and conductive layers are necessary to connect the inner terminus of the winding with other circuitry on the substrate. In addition to these problems, valuable substrate surface area is sacrificed where both the primary and secondary windings of the transformer are placed on the same substrate.

U.S. Pat. No. 4,543,553 attempts to overcome the problem of limited surface area by stacking double-sided magnetic layers on top of one another to simulate a three-dimensional coil. Each of the double-sided magnetic layers contains a single, printed turn of a rectangular coil, and the layers are staggered in relation to one another so that both sides of each layer add turns to the coil. Corresponding conductive turns on the upper and lower sides of selected magnetic layers are electrically connected and mechanically adhered to one another by heating, crimping and sintering the layers via through-holes provided in a middle-layer positioned between the top and bottom layers. Thus, a laminated structure is formed, and electrodes are subsequently placed on opposite ends of the laminated structure in order to form a chip inductor. Although the above-mentioned process uses printed conductor turns, the advantages of a low-profile device having a two-dimensional screen-printed or etched winding are lost through stacking of the magnetic layers. Moreover, the process for electrically and mechanically connecting the coil turns and the need for additional electrodes adds expense and makes fabrication of the chip inductor difficult.

U.S. Pat. No. 5,010,314 also discloses planar magnetic elements. The patent teaches two flat bobbin trays each having a raised rectangular guide at its center. The trays house substrates supporting the primary and secondary spiral conductive patterns of a transformer. Layers of dielectric sheet material are provided between the substrate layers supporting the windings as well as between the two bobbin trays. Top and bottom inductive cores extend through an aperture formed in the center of the bobbins, the substrates and the dielectric layers so as to magnetically couple the planar windings to the core. Connections between different conductive layers are established by solder leads that extend beyond the perimeter of the laminated structure. The use of bobbins in the configuration eliminates the advantages associated with a low-profile, planar element. Moreover, the plurality of layers needed to form the element and the solder leads required for connections between layers make the transformer both expensive and difficult to fabricate.

Accordingly, it is a general object of the present invention to provide a low-profile printed circuit board which includes at least one planar magnetic element formed integrally with other circuitry carried on the board.

It is another object of the invention to provide a planar magnetic element which does not require mechanical connections to connect windings or portions of windings with one another or with other circuitry on the printed circuit board.

It is a still further object of the present invention to electrically insulate the windings or portions of the windings comprising such a planar magnetic element from one another without the need for the expensive dielectric layers used in the past.

SUMMARY OF THE INVENTION

The present invention meets these and other objects by providing a low-profile printed circuit board which includes a substrate having a conductive circuit formed on both sides thereof. The printed circuit board further includes at least one planar magnetic element supported on the substrate. The planar magnetic element includes a winding comprising at least one spiral conductive pattern disposed on at least one side of the substrate integrally with the conductive circuit formed on that side. The spiral pattern has an inner end and an outer end, and the outer end of the spiral pattern is connected with at least a portion of the conductive circuit. The spiral pattern is magnetically coupled to an inductive core which is mounted on both sides of the substrate and extends through apertures formed in the substrate. Together, the spiral pattern and the inductive core provide a closed magnetic loop. At least one through-hole plated with an electrically conductive coating is provided in the substrate. The through-hole provides a conductive path to connect the inner end of the spiral conductive pattern with the conductive circuit formed on the opposite side of the substrate or to continue the spiral pattern from one side to the opposite side of the substrate.

In a second embodiment of the invention, the printed circuit board further comprises at least a second substrate having a winding comprising at least a second spiral conductive pattern disposed on one side thereof. That is, the printed circuit board includes one or more substrates having a spiral conductive pattern disposed on one side thereof, in addition to the first substrate. The second spiral pattern has an inner end which is electrically connected to at least one plated through-hole formed in the second substrate which provides a conductive path between the two sides of the second substrate. A first terminal is provided on the second substrate, and the outer end of the second spiral pattern is electrically connected to the first terminal on the same side of the second substrate which carries the second spiral pattern. A second terminal is also provided on the substrate, and the second terminal is electrically connected to the conductive path provided by the plated through-hole on the side of the second substrate opposite the side carrying the second spiral pattern. Alternatively, the second spiral pattern may continue from one side of the second substrate to the other side via the conductive path provided by the through-hole and connect with the second terminal. In either case, means for mounting the second substrate on the first substrate with the second spiral pattern in overlying relationship to the first spiral pattern are provided. When the second substrate is so mounted, the second spiral pattern is electrically connected to at least one of the conductive circuits formed on the first substrate via plated terminal through-holes formed in the first and second terminal pads.

As mentioned previously, it is often difficult in applications utilizing planar magnetic elements to provide complete isolation between stacked planar windings and between the windings and the inductive core to which they are magnetically coupled. Accordingly, it is another aspect of the invention to provide a dielectric barrier to isolate the first spiral pattern from the second spiral pattern and to isolate both spiral patterns from their associated inductive core. In a preferred embodiment of the invention, the dielectric barrier is a coating of dry solder mask which completely surrounds each spiral pattern.

BRIEF DESCRIPTION OF THE DRAWINGS

FIG. 4 is an exploded perspective view of a low-profile printed circuit board in accordance with the invention.

FIG. 5 is a cross-sectional view of the printed circuit board illustrated in FIG. 1 taken along the line 5—5 of FIG. 1.

DETAILED DESCRIPTION OF THE INVENTION

Figure 2:
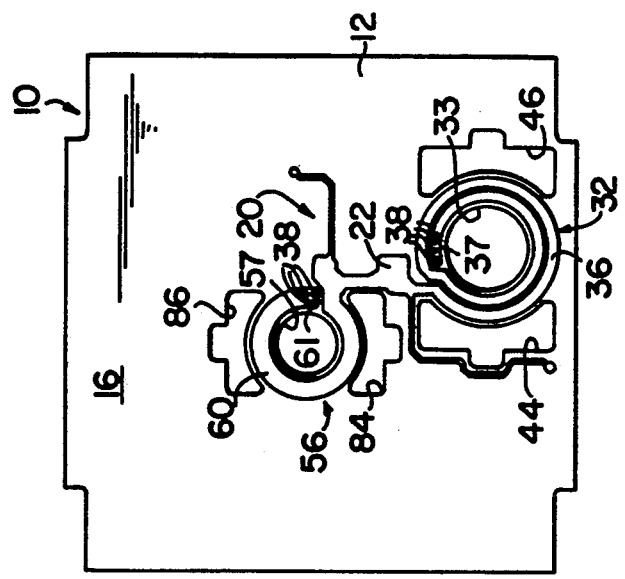
FIG. 2 is a bottom plan view of the partially assembled printed circuit board illustrated in FIG. 1.

FIGS. 1-4 illustrate a low-profile printed circuit board according to the invention. The printed circuit board 10 comprises a substrate 12 having a first side 14 and a second side 16. The substrate 12 is composed of, for example, plastic or ceramic. Each of the sides 14 and 16 has a conductive circuit, shown generally at 18 and 20, respectively, formed thereon. The conductive circuits 18, 20 include, for example, interconnect paths 22, 22 and bases 24, 24 to which discrete circuit components 26, 26, such as, for example, transistors, capacitors, diodes and the like are attached. As those skilled in the art will recognize, the conductive circuits may be formed by selectively etching portions of a conductive coating (not shown), such as a copper coating, applied to the substrate 12. Alternatively, the conductive circuits may be formed by thick-film technology, such as by screen-printing on the substrate with a conductive paste.

The printed circuit board 10 further includes at least one planar magnetic element. As shown in FIG. 4 such elements include, for example, the planar magnetic inductor 28, which includes inductor winding 32 and inductive core halves 40, 42, and transformer 30, which includes primary winding 56, secondary winding 50 and inductive core halves 80, 82.

Figure 1:
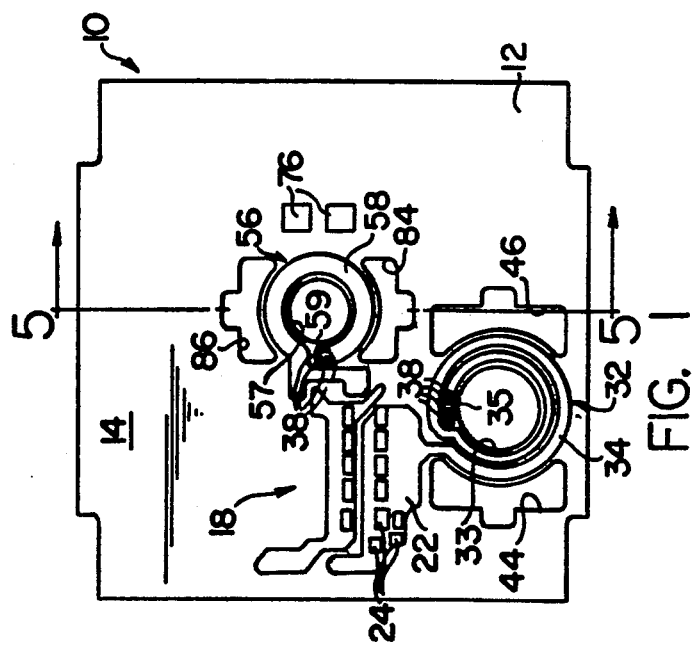
FIG. 1 is a top plan view of a partially assembled printed circuit board according to the invention.

Referring in particular to FIGS. 1 and 2, the inductor 28 comprises a planar inductor winding 32 disposed around an aperture 33 formed in the substrate. It is an important aspect of the invention that the inductor winding 32 is formed integrally with the conductive circuits 18 and 20. That is, a spiral conductive pattern 34 having an inner end 35 is etched or deposited at the same time and integrally with the circuit 18 when it is formed on side 14 of substrate 12, and a corresponding spiral conductive pattern 36 having an inner end 37 is etched or deposited at the same time and integrally with circuit 20 when it is formed on side 16 of substrate 12. The substrate 12 has at least one through-hole 38 (four are illustrated) formed therein. The boundaries of the hole are coated with a conductive plating to provide a conductive path that connects the inner end 35 of spiral pattern 34 with the inner end 37 of spiral pattern 36 to complete planar winding 32. As can be readily appreciated, plated through-holes 38 also provide a conductive path connecting spiral pattern 34 and conductive circuit 18 with conductive circuit 20. Thus, the plated through-holes completely eliminate the need for the mechanical bridges and solder connections or the multi-layer circuits used in the prior art to connect the inner end of a planar spiral winding with other circuitry on a printed circuit board including such a winding.

The spiral patterns 34, 36 are illustrated in the figures as two circular winding turns. This need not be the case however. Depending on the circuit design, the spirals could have almost any shape; for example, the spirals could be square-shaped, rectangular or elliptical. Again, depending on the requirements of the circuit, the planar winding could include one or any number of turns. Moreover, in particular instances it may not be necessary to continue the spiral conductive pattern via the through-hole from one side of the substrate to the opposite side. A winding formed from a spiral pattern disposed on one side of the substrate only may be sufficient. Of course, even in such a case the plated through hole would be necessary to provide a conductive path between the winding and its associated conductive circuit and the conductive circuit formed on the opposite side of the substrate.

As shown in FIG. 4, is constructed by magnetically coupling the planar winding 32 to an inductive core made, for example, from a ferrite material to form a closed magnetic loop. This is accomplished by mating two E-shaped core halves 40 and 42 which extend through aperture 33 and core slots 44 and 46. Once the core halves are mated, they are clipped or bonded together to complete the inductor. As is well-known to those skilled in the art, the inductive core may have a shape other than the illustrate E-shape; of course, the core slots may have to be altered accordingly.

Figure 3B:
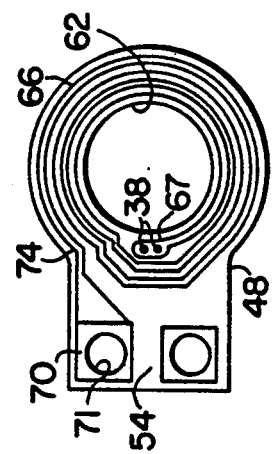
FIG. 3b is a bottom plan view of a surface mounted component of the printed circuit board illustrated in FIG. 1.
Figure 3A:
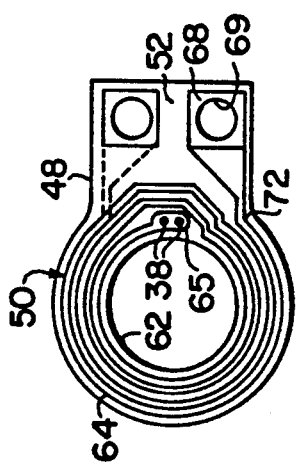
FIG. 3a is a top plan view of a surface mounted component of the printed circuit board illustrated in FIG. 1.

Referring now to FIGS. 1-4, according to a second embodiment of the invention, a second substrate, such as the substrate 48 shown in FIGS. 3a and 3b, is provided. The second substrate has an additional planar winding 50 disposed on both sides 52 and 54 thereof. In the present case the additional planar winding forms the secondary winding of the transformer 30. Of course, those skilled in the art will appreciate that the additional winding 50 disposed on the second substrate 48 may have any number of other uses depending on the design of the particular circuit of which it forms a part. For example, the additional winding may provide additional winding turns for the inductor 28.

Referring specifically now to the transformer 30 and to FIGS. 1 and 2, the transformer includes a planar primary winding 56 disposed around an aperture 57 formed in the first substrate 12. The primary winding of the transformer is illustrated here as a single-turn spiral winding but could, as noted previously, be shaped differently and include additional turns depending on the requirements of the circuit. As in the case of the planar inductor winding 32, the primary winding 56 is formed integrally with the conductive circuits 18 and 20. Thus, a spiral conductive pattern 58 having an inner end 59 is etched or deposited at the same time and integrally with the circuit 18 when it is formed on side 14 of substrate 12, and a corresponding spiral conductive pattern 60 having an inner end 61 is etched or deposited at the same time and integrally with circuit 20 when it is formed on side 16 of substrate 12. At least one plated through-hole 38 (four are illustrated) is provided in substrate 12 to provide a conductive path which connects the inner end 59 of spiral pattern 58 with inner end 61 of spiral pattern 60 to complete primary winding 56. Further, as in the case of inductor 28, plated through-hole 38 also provides a conductive path connecting spiral pattern 58 and conductive circuit 18 with conductive circuit 20, without the need for mechanical bridges and solder connections or multi-layer circuits.

As previously noted, the planar winding 50 on the second substrate 48 provides the secondary winding for the transformer 30. As shown in FIGS. 3a and 3b, the secondary winding 50 is disposed around aperture 62 provided in substrate 48. The secondary winding 50 is formed by etching or screenprinting a spiral conductive pattern 64 and a spiral conductive pattern 66 on sides 52 and 54, respectively, of the second substrate 48. At least one plated through-hole 38 (two are illustrated) is formed in the second substrate to connect the inner end 65 of spiral pattern 64 with the inner end 67 of spiral pattern 66 to complete planar secondary winding 50.

The second substrate 48 also includes two terminals 68 and 70. The outer end 72 of spiral pattern 64 is electrically connected on side 52 of the second substrate to terminal 68. The outer end 74 of spiral pattern 66 is electrically connected on side 54 to terminal 70. Thus, planar secondary winding 50 begins at terminal 68, spirals around aperture 62 on side 52 of substrate 48, continues to the opposite side 54 of the second substrate via plated through-holes 38, spirals around aperture 62 on side 54 of substrate 48 and terminates at terminal 70 on side 54. Terminals 68 and 70 respectively include plated terminal through holes 69 and 71. Thus, the terminals 68 and 70 are electrically accessible from either side of the second substrate even when, as described below, the second substrate is surface mounted on the first substrate.

Referring in particular to FIG. 4, the transformer is assembled by first surface mounting the second substrate 48 onto substrate 12 with secondary winding 50 overlying primary winding 56 and with terminals 68 and 70 aligned and in contact with conductive receiving pads 76, 76 provided on substrate 12 for this purpose. The pads are etched or screen-printed onto substrate 12 at the same time conductive circuit 18 is formed thereon and are coated with a re-flowable solder. Thus, the second substrate 48 is mechanically attached to substrate 12 and the secondary winding 50 is electrically connected to the circuitry carried on substrate 12 by simply re-flowing the solder coated on the receiving pads 76,76. During this process the terminal through-holes 69 and 71 not only permit electrical access to the terminals 68 and 70 from either side of the second substrate 48, but also allow visual inspection of the solder connection thereby insuring that the connections are complete. Of course, in a less-automated manufacturing process, the terminals 68 and 70 could be hand-soldered onto the receiving pads.

To complete the transformer 30, an inductive core is magnetically coupled to the primary and secondary windings to form a closed magnetic loop. As in the case of the inductor, this is accomplished by mating two E-shaped core halves 80 and 82 which extend through aperture 57 and core slots 84 and 86 in substrate 12 and through aperture 62 in substrate 48. Once the core halves are mated, they are clipped or bonded together to complete the transformer.

As mentioned previously, it has proven difficult in the past to electrically insulate planar magnetic windings not only from one another when they are stacked in overlying relationship, as in the case of transformer 30, but also from the induction cores which surround them. Several attempts to address this problem are disclosed in the prior art discussed above. Another approach has been to place a sheet of insulating material over a planar spiral winding and then selectively remove those portions of the insulating sheet which do not correspond with the winding. The disadvantage here is that the available insulating sheet materials which are formed from, for example, polyamide, are all quite expensive.

It is a further aspect of the present invention that this layer of expensive insulating material is eliminated. Referring now to FIG. 5, the primary transformer winding 56 includes a coating 88 of a dielectric material which has been used in the past only as a solder mask. The dielectric solder mask is applied as sheets 90 and 92 to sides 14 and 16, respectively, of the substrate 12. Portions of each sheet are selectively removed by well-known methods to provide the coating 88 which completely covers the spiral conductive patterns 58 and 60 that comprise the primary transformer winding 56. The sheets 90 and 92 extend into aperture 57 beyond the inner edge 93 of substrate 12 which defines aperture 57 and join at seam 94 to provide margin 96. The sheets also extend beyond the outer edge 95 of that portion of substrate 12 on which winding 56 is disposed and join at seam 97 to form margin 98. This ensures that the primary winding 56 is completely insulated from both secondary winding 50 and the inductive core formed from core halves 80 and 82. While not illustrated, inductor winding 32 and the secondary transformer winding 50 include this same coating.

As noted previously, the coating 88 comprises a dry solder mask which, in the present case is also used as a dielectric. Any solder mask known to those skilled in the art may be used as long as the solder mask has a dielectric strength of at least 50 V/ml and a dielectric constant of at least about 1.5. The required isolation voltage determines the thickness of the coating 88, and the coating may be applied as a single layer or as multiple layers to reach the desired thickness. In the preferred embodiment of the invention, the solder mask has a dielectric strength of about 500 V/ml and a dielectric constant of about 3.6. In a preferred embodiment of the invention, the coating is formed from a dielectric solder mask sold under the trademark VACREL, available from Dupont Electronics, Burlington, Mass.

While preferred embodiments have been shown and described, various modifications and substitutions may be made without departing from the spirit and scope of the invention. Accordingly, it is to be understood that the present invention has been described by way of example and not by limitation.

We claim:

1. A low-profile printed circuit board comprising:
a first substrate having a first side and a second side, each of said sides having a conductive circuit formed thereon:
at least one planar magnetic element supported on the first substrate, said planar magnetic element including a planar winding comprising at least a first spiral conductive pattern disposed on at least one of said sides integrally with the conductive circuit formed on said side, said first spiral pattern having an inner end and an outer end, the outer end of said first spiral pattern connected with at least a portion of the conductive circuit formed on said side, said planar magnetic element further including an inductive core mounted on both sides of the first substrate and extending through apertures defined by the first substrate, wherein the first spiral pattern and the inductive core are magnetically coupled to provide a closed magnetic loop;

said first substrate further defining at least one through hole, the boundaries of said hole having a conductive plating thereon, the plated through hole providing a conductive path between the inner end of the spiral pattern disposed on one of said sides of the first substrate and the other of said sides of the substrate;

at least a second substrate having a third side and a fourth side and having a winding comprising at least a second spiral conductive pattern disposed on the third side thereof, the second spiral pattern having an inner end and an outer end on the third sides of the second substrate, the outer end of the second spiral pattern electrically connected on the third side of the second substrate to a first terminal disposed on the second substrate and the inner end of the second spiral pattern electrically connected to at least one through-hole defined by the second substrate, the boundaries of said through-hole having a conductive plating thereon to provide a conductive path between the third and fourth sides of the second substrate;

a second terminal disposed on the second substrate and electrically connected on the fourth side of the second substrate to the conductive path provided by the through-hole; and means for mounting the second substrate on the first substrate with the second spiral pattern in overlying relationship to the first spiral pattern, said first and second terminals defining terminal through holes to electrically connect the second spiral pattern to at least one of the conductive circuits formed on the first substrate when the second substrate is mounted on the first substrate.

2. The printed circuit board of claim 1 wherein the second spiral pattern continues from the third side to the fourth side of the second substrate, said plated through-hole providing a conductive path from between the third and fourth sides of the second substrate.

3. The printed circuit board of claim 1 wherein the means for mounting the second substrate on the first substrate comprises the first and second terminal and corresponding receiving pads disposed on the first substrate.

4. The printed circuit board of claim 1 further comprising a dialectic barrier to insulate the first spiral pattern from the second spiral pattern and to isolate both of said patterns from the inductive core to which they are magnetically coupled, said dielectric barrier comprising a dry solder mask.

5. The printed circuit board of claim 4 wherein the dielectric barrier completely surrounds each of said first and second spiral patterns.

* * * * *